US011600544B2

(12) United States Patent
Chandiran et al.

(10) Patent No.: US 11,600,544 B2
(45) Date of Patent: Mar. 7, 2023

(54) CHIP PACKAGE WITH STAGGERED PIN PATTERN

(71) Applicant: INTEL CORPORATION, Santa Clara, CA (US)

(72) Inventors: Yogasundaram Chandiran, Hosur (IN); Geejagaaru Krishnamurthy Sandesh, Bangalore (IN); Pradeep Ramesh, Bangalore (IN); Ranjul Balakrishnan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 861 days.

(21) Appl. No.: 16/286,736

(22) Filed: Feb. 27, 2019

(65) Prior Publication Data

US 2020/0273765 A1 Aug. 27, 2020

(51) Int. Cl.
*H01L 23/498* (2006.01)
*H01L 23/31* (2006.01)
*H05K 1/11* (2006.01)
*H05K 1/02* (2006.01)
*H05K 1/18* (2006.01)

(52) U.S. Cl.
CPC .... *H01L 23/3114* (2013.01); *H01L 23/49827* (2013.01); *H05K 1/0298* (2013.01); *H05K 1/115* (2013.01); *H05K 1/181* (2013.01)

(58) Field of Classification Search
CPC ........... H01L 23/3114; H01L 23/49827; H01L 24/02; H01L 24/04; H01L 24/06; H01L 24/07; H01L 24/09; H01L 23/12; H01L 23/13; H01L 23/481; H01L 23/485; H01L 23/498; H01L 23/49805; H01L 23/49822; H01L 23/49838; H01L 23/5226; H01L 23/528; H01L 23/5283; H01L 23/5286; H05K 1/0298; H05K 1/115; H05K 1/181
See application file for complete search history.

(56) References Cited

U.S. PATENT DOCUMENTS 5,767,575 A * 6/1998 Lan .................... H01L 24/49
257/E23.079
5,821,567 A * 10/1998 Ogihara .............. H01L 27/1446
257/88
6,316,285 B1 * 11/2001 Jiang ...................... H01L 23/13
438/106

(Continued)

*Primary Examiner* — Eduardo A Rodela
(74) *Attorney, Agent, or Firm* — Schwabe, Williamson & Wyatt, P.C.

(57) ABSTRACT

A PCB having a first surface and a second surface includes a trench extending through the PCB, a plurality of conductive traces on one or more sidewalls of the trench. The plurality of conductive traces extends through the PCB and may be arranged in pairs across from one another along at least a portion of the length of the trench. A first set of conductive contacts are arranged in a first zig-zag pattern around a perimeter of the trench. A second set of conductive contacts are arranged in a second zig-zag pattern around the perimeter of the trench. In some cases, the first and second zig-zag patterns are arranged with respect to one another around the perimeter of the trench in an alternating fashion. A chip package is also disclosed having a pin arrangement that couples to the corresponding arrangement of conductive contacts on the PCB.

9 Claims, 7 Drawing Sheets

(56) References Cited

U.S. PATENT DOCUMENTS

| | | | | |
|---|---|---|---|---|
| 6,392,291 | B1 * | 5/2002 | Corisis | H01L 24/11 |
| | | | | 257/734 |
| 6,548,757 | B1 * | 4/2003 | Russell | H01L 24/06 |
| | | | | 257/E23.079 |
| 6,906,409 | B2 * | 6/2005 | King | H01L 25/0655 |
| | | | | 257/725 |
| 7,745,944 | B2 * | 6/2010 | Fee | H01L 24/06 |
| | | | | 257/E23.001 |
| 7,750,456 | B2 * | 7/2010 | Roh | H01L 24/97 |
| | | | | 257/676 |
| 7,915,718 | B2 * | 3/2011 | Lee | H01L 23/5383 |
| | | | | 257/668 |
| 2008/0029876 | A1 * | 2/2008 | Niu | H01L 24/81 |
| | | | | 257/E23.021 |
| 2016/0249458 | A1 | 8/2016 | Tourne | |

* cited by examiner

CHIP PACKAGE WITH STAGGERED PIN PATTERN

BACKGROUND

Specifications for printed circuit board (PCB) design are constantly evolving in order to interface with the latest processor and memory configurations. Achieving high signal speeds while maintaining a dense array of signal traces presents many challenges using standard technology.

BRIEF DESCRIPTION OF THE DRAWINGS

Features and advantages of embodiments of the claimed subject matter will become apparent as the following Detailed Description proceeds, and upon reference to the Drawings, in which:

Figure 1:
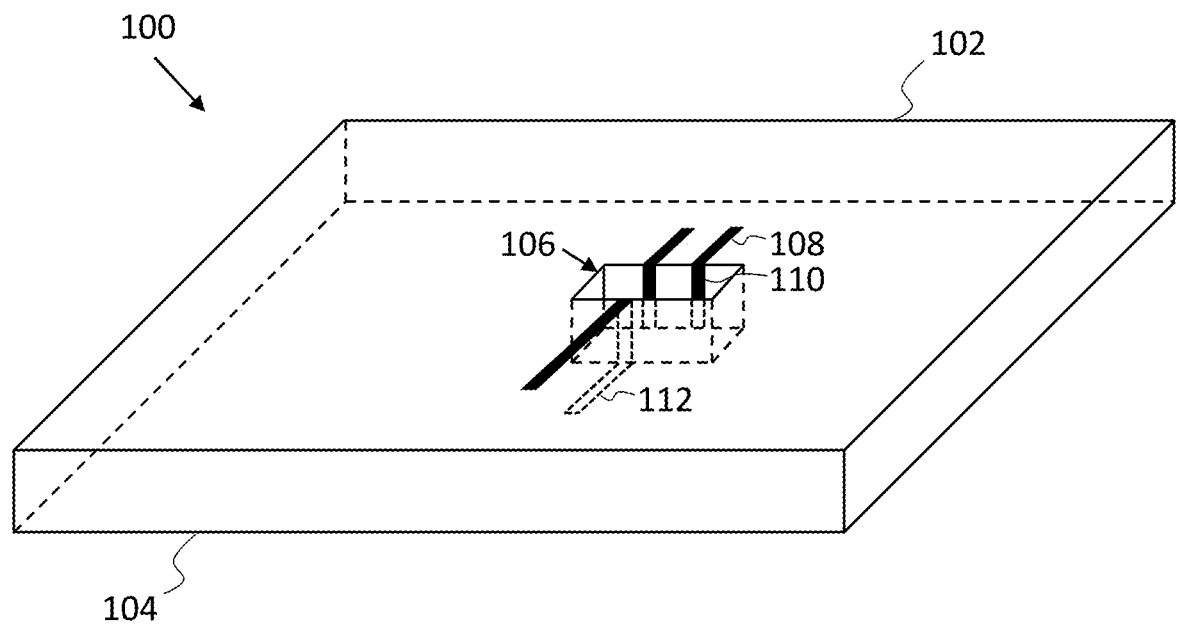
FIG. 1 illustrates a perspective view of a printed circuit board (PCB), configured in accordance with some embodiments of the present disclosure.

Although the following Detailed Description will proceed with reference being made to illustrative embodiments, many alternatives, modifications, and variations thereof will be apparent in light of this disclosure.

DETAILED DESCRIPTION

As noted above, achieving high signal speeds while maintaining a dense array of signal traces presents many challenges using standard technology. For example, existing plated through hole (PTH) technology suffers from a high impedance mismatch along the vertical height of the contact, which can require expensive and time-consuming mechanical drilling steps to correct. To this end, techniques and designs are provided herein for an improved routing structure on a PCB. The PCB routing structure utilizes vertical conductive structures in place of cylindrical plated vias. In addition, the vertical conductive structures can be used in conjunction with a new pin or ball grid pattern and/or a zig-zag signal assignment approach. To this end, a new ball grid arrangement on a chip package is also disclosed for coupling to the new PCB layout. The embodiments described herein improve the manufacturing of ICs and PCBs by reducing the footprint while lowering crosstalk and generally improving signal fidelity on the patterned conductive traces.

In an embodiment, a PCB having a first surface and an opposite, parallel second surface includes a trench extending through the PCB. In addition to having a depth or thickness that extends through the PCB, the trench further includes a length and a width that each extend laterally across a portion of the PCB. The trench is elongate, in that the width of the trench is shorter than its length. In addition, a plurality of conductive traces is on one or more sidewalls of the trench, so as to connect conductive features on the first surface of the PCB to conductive features on the second surface of the PCB. In some such cases, the plurality of conductive traces is arranged in pairs across from one another along opposing sidewalls of the trench. In any case, the conductive features of the PCB may include, for instance, a plurality of conductive contacts arranged along the perimeter of the trench and on both sides of the PCB. A first set of the conductive contacts are for signals (e.g., logic signals, control signals, power signals, etc) and are arranged in a first zig-zag pattern around the trench perimeter, and a second set of the conductive contacts are part of a ground plane of the PCB and are arranged in a second zig-zag pattern around the trench perimeter. The ground plane is electrically isolated from the first set of conductive contacts that carry signals. In one such embodiment, the first and second zig-zag patterns are arranged with respect to one another around the trench in an alternating fashion, such that the vertices of one zig-zag pattern are directly opposite the vertices of the other zig-zag pattern, with the trench being between those opposing vertices.

As will be further appreciated, and according to some embodiments, at least some of the conductive contacts around the perimeter of the trench are coupled to conductive traces of within the trench. So, the traces within the trench may pass one or both of signals and ground, as will be appreciated. Thus, in some such embodiments, there is a first zig-zag pattern of conductive traces (within the trench) coupled to the ground plane on the first and/or second surfaces of the PCB, and a second zig-zag pattern of the conductive traces (within the trench) coupled to non-ground conductive contacts on the first and/or second surfaces of the PCB. In some such cases, the first and second zig-zag patterns are arranged with respect to one another within the trench in an alternating fashion, such that the vertices of one zig-zag pattern are directly opposite the vertices of the other zig-zag pattern. Thus, a given conductive trace of the first zig-zag pattern is on a location of the trench sidewall that is opposite the trench sidewall location of a given conductive trace of the second zig-zag pattern.

In another embodiment, a chip package includes a package substrate having a first surface and an opposite parallel second surface, a housing that protects one or more integrated circuit chips coupled to the first surface of the package substrate, and an array of conductive contacts on the second surface of the package substrate. The array of conductive contacts is designed to electrically couple to one or more corresponding conductive contacts on a substrate separate from the chip package. The array of conductive contacts has a staggered two-dimensional arrangement, such that a first column of conductive contacts is separated from a second column of conductive contacts in a first direction by a first distance. The second column of conductive contacts are located at different positions in a second direction perpendicular to the first direction from the first column of conductive contacts, and the second column of conductive contacts is separated from a third column of conductive contacts in the first direction by a second distance less than the first distance. The third column of conductive contacts are located at different positions in the second direction from the second column of conductive contacts.

Numerous variations and embodiments will be appreciated in light of this disclosure. Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 15" may be used to refer to the collection of drawings of FIGS. 15A-15C, the phrase "FIG. 16" may be used to refer to the collection of drawings of FIGS. 16A-16B, etc.

PCB Design

FIG. 1 illustrates a substrate 100 having a first surface 102 and an opposite, parallel second surface 104. In some embodiments, substrate 100 is a PCB that includes any number of laminated dielectric layers with a total thickness between about 1.0 mm and about 2.0 mm, although other thicknesses will be appreciated. In some embodiments, the dielectric material of the one or more dielectric layers includes an organic dielectric material, a fire-retardant grade 4 material (FR-4), bismaleimide triazine (BT) resin, polyimide materials, glass reinforced epoxy matrix materials, high-k dielectric, low-k or ultra low-k dielectric (e.g., carbon-doped dielectrics, fluorine-doped dielectrics, porous dielectrics, and organic polymeric dielectrics).

Substrate 100 may include one or more etched trenches, such as trench 106, that extend through a thickness of substrate 100. Trench 106 may extend through an entire thickness of substrate 100, or just a portion of the entire thickness. Trench 106 may be characterized as having a length greater than its width (e.g., a slot design).

According to some embodiments, one or more conductive traces 108 patterned on first surface 102 of substrate 100 are conductively coupled to one or more conductive sidewall traces 110 on one or more sidewalls of trench 106. One or more conductive sidewall traces 110 may have substantially the same (e.g., within 1 nm of each other) width as one or more conductive traces 108, while other embodiments allow for different trace widths to, for instance, accommodate different current levels. In some embodiments, one or more conductive traces 112 patterned on second surface 104 of substrate 100 are conductively coupled to one or more conductive sidewall traces 110. In this way, signals may be routed from conductive traces patterned on first surface 102 of substrate 100 to conductive traces patterned on second surface 104 of substrate 100 via one or more conductive sidewall traces 110. In some embodiments, signals may be routed from conductive traces patterned on one or both of first surface 102 and second surface 104 of substrate 100 to conductive traces patterned on any internal layer within a thickness of substrate 100. Each of one or more conductive traces 108, one or more conductive sidewall traces 110, and one or more conductive traces 112 may be constructed of any type of conductive material suitable for routing electrical signals. In one example, the various conductive traces are made of copper, though other metals or metal alloys can be used as well (e.g., gold, silver, aluminum, etc). In some embodiments, an interior volume of trench 106 is filled with any electrically insulating material.

Figure 2:
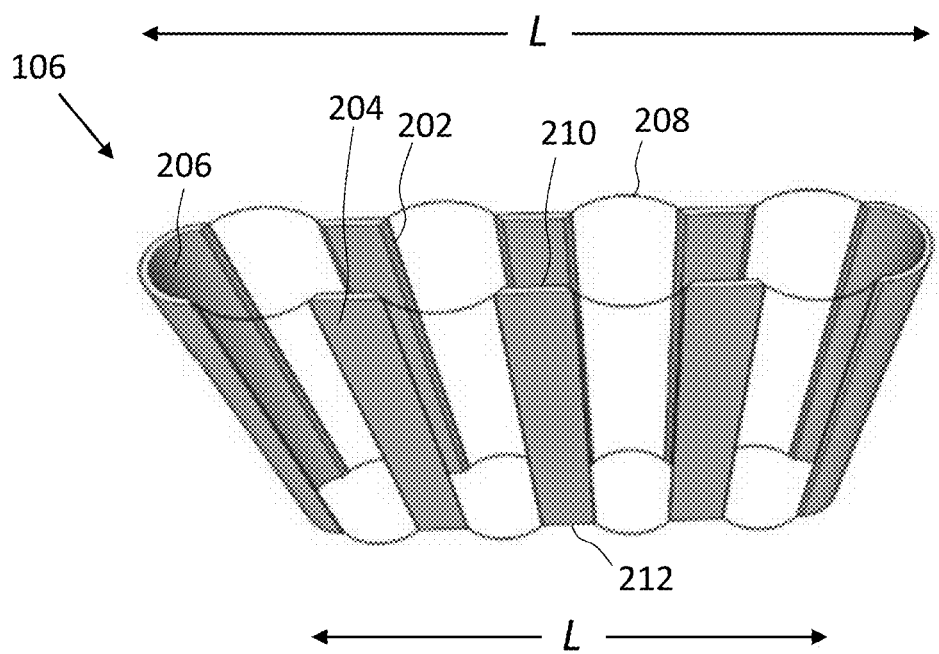
FIG. 2 illustrates a perspective view of vertical conductive structures, configured in accordance with some embodiments of the present disclosure.

Any number of conductive traces may be patterned along the sidewalls of trench 106, and only three are illustrated in FIG. 1 for clarity. For example, FIG. 2 illustrates a three-dimensional view of trench 106 having eight conductive sidewall traces, with three along one side, three along an opposite side, and one trace at each opposite end of trench 106. Further note that the geometry of the trench will vary from embodiment to embodiment, and may include, for instance, tapering of sidewalls, rounded corners, rounded end walls, and other features indicative or real-world process limitations. The remainder of the substrate, including any additional features (e.g., componentry, traces, connectors, etc) thereon, is not shown for clarity and to focus on particular features of trench 106. The conductive sidewall traces may be arranged in a particular pattern or a pseudo-random pattern, but in some embodiments are provided in an opposing fashion, such as shown in FIG. 2.

In more detail, in the illustrated embodiment, conductive traces 202 and 204 are conductive traces that are patterned across from one another along sidewalls of trench 106. Conductive traces 202 and 204 can be characterized as forming a pair of conductive traces, and this pattern is repeated down at least a portion of the length L of trench 106, so as to provide a series of opposing conductive trace pairs. According to some embodiments, trench 106 has the same length L at its top surface and at its bottom surface. Another conductive trace 206 may be patterned along an end sidewall at either or both ends of trench 106, as further depicted.

Unpatterned sidewall regions 208 may be present between patterned conductive traces. Unpatterned sidewall regions 208 may include a curved shape as illustrated in FIG. 2 formed due to a fabrication procedure of trench 106. In other embodiments, unpatterned sidewall regions 208 have straight sidewalls.

A given conductive trace on a sidewall of trench 106 may be characterized as having a top edge 210 and an opposite bottom edge 212. Top edge 210 may be conductively connected to another patterned trace or contact pad on a top surface of the substrate. Similarly, bottom edge 212 may be conductively connected to another patterned trace or contact pad on a bottom surface of the substrate.

Different characteristics and features of trench 106 may vary, as will be appreciated based on the disclosure herein. For example, the conductive traces patterned on one or more of the sidewalls of trench 106 may be oriented at any angle on the sidewall. In another example, the conductive traces can have varying heights such that some of the conductive traces route signals between the top and bottom surfaces of the substrate while other conductive traces route signals between the top or bottom surface and an intermediate layer of the substrate. The trench 106 and its traces can be formed using standard technology.

Figure 3A:
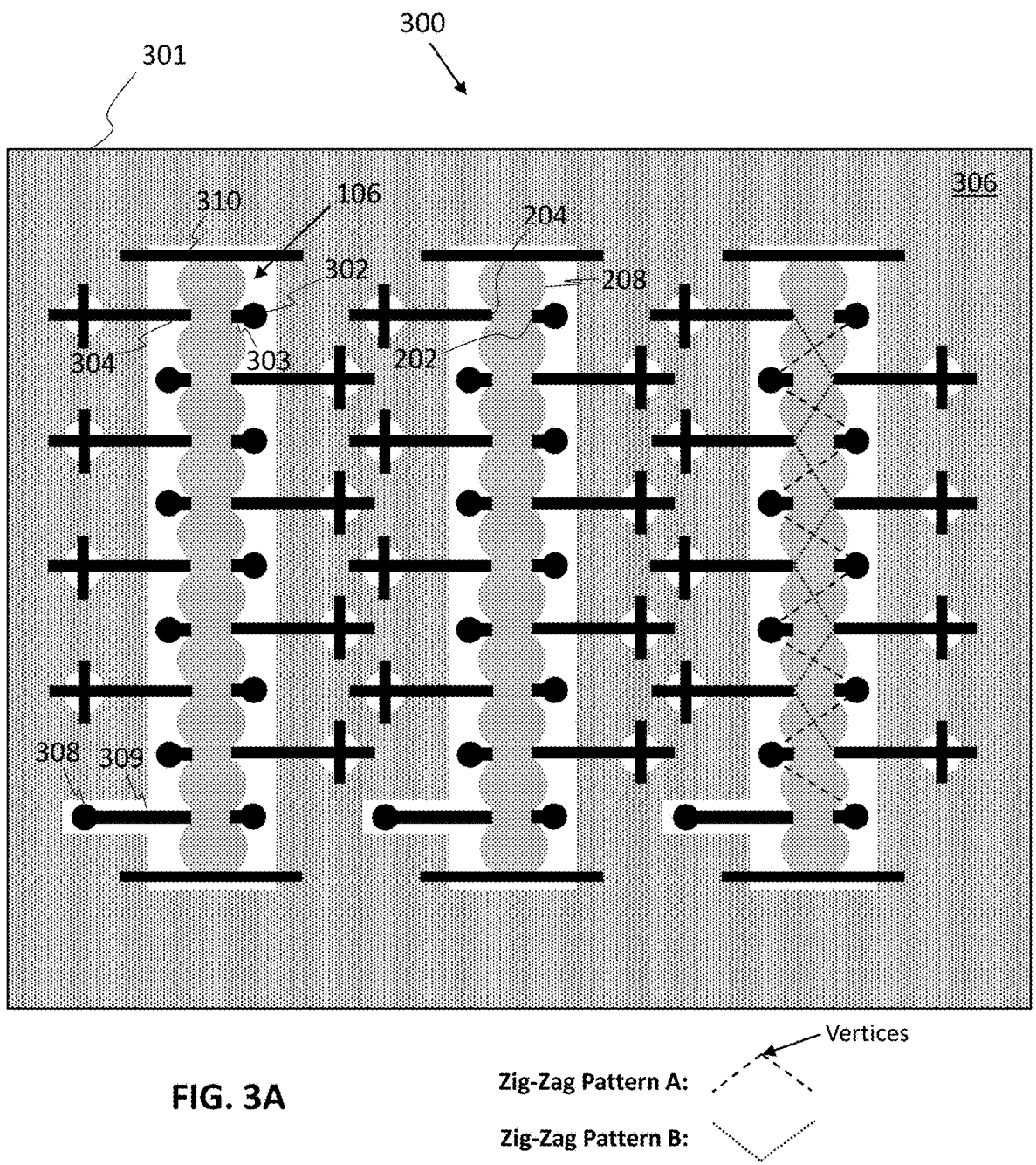
FIG. 3A illustrates a top-down view of one surface of a PCB, configured in accordance with an embodiment of the present disclosure.

FIG. 3A illustrates a top-down view of a first surface 301 of a PCB 300, according to an embodiment. PCB 300 may have the same characteristics as those described previously for substrate 100. PCB 300 includes one or more trenches 106. Trenches 106 may be arranged in an array pattern, such as the pattern illustrated in FIG. 3A, or in any other suitable pattern. Discussion herein with regards to one trench 106 and the accompanying conductive contacts and traces coupled to it can apply to any other trench 106 on PCB 300.

According to an embodiment, a plurality of conductive contacts 302 are formed on first surface 301 of PCB 300. Conductive contacts 302 may be bonding pads designed to bond with contacts of a chip package, such as solder balls or any other conductive contact used on the underside of the chip package. In some embodiments, conductive contacts 302 are made of a metal or metal alloy material. Conductive contacts 302 may include a layered stack of different metal or metal alloy materials. Conductive contacts 302 may be patterned to have a circular shape, as is illustrated in FIG. 3A, although any other shapes may be used as well.

One or more of conductive contacts 302 includes a conductive trace 303 that leads to one sidewall edge of trench 106. According to an embodiment, conductive trace 303 is conductively coupled with a sidewall conductive trace of trench 106 (such as, for example, conductive trace 202 illustrated in FIG. 2, and also identified in FIG. 3A) to route signals through a thickness of PCB 300.

According to an embodiment, conductive contacts 302 are alternatingly arranged in a zig-zag pattern along at least a portion of the length of trench 106. An example of this zig-zag pattern is superimposed over the far-right trench 106 shown in FIG. 3A with a dashed line designated zig-zag pattern A. Accordingly, a first conductive contact is coupled to one sidewall conductive trace of the pair of sidewall conductive traces in a first row of trench 106, a second conductive contact is coupled to an opposite sidewall conductive trace of the pair of sidewall conductive traces in a second row of trench 106, and so on along at least the portion of the length of trench 106.

In a similar fashion as that discussed above regarding the zig-zag pattern of conductive contacts 302, grounded conductive contacts or traces 304 may be coupled to one sidewall conductive trace in each pair of sidewall conductive traces across from the sidewall conductive trace coupled to conductive contact 302 along the portion of the length of trench 106 (such as, for example, conductive trace 204 illustrated in FIG. 2, and also identified in FIG. 3A). An example of this zig-zag pattern is superimposed over the far-right trench 106 shown in FIG. 3A with a dashed line designated zig-zag pattern B. In this way, grounded conductive traces 304 also are coupled to sidewall conductive traces in a zig-zag pattern along the portion of the length of trench 106. Grounded conductive traces 304 may each be coupled to a ground plane 306. Ground plane 306 is made of any metal or metal alloy material, according to some embodiments. Ground plane 306 may extend across any portion of first surface 301, except for the regions where trenches 106 and conductive contacts 302 are located, as illustrated in FIG. 3A. In some other embodiments, ground plane 306 is located on a different level of PCB 300 (e.g., on a plane within the thickness of PCB 300.)

By alternating the arrangement of both conductive contacts 302 and grounded conductive traces 304 along a portion of trench 106, each pair of sidewall conductive traces facing each other includes one sidewall conductive trace being coupled to ground plane 306 and the opposite sidewall conductive trace being coupled to a corresponding conductive contact 302. After bonding a chip package to one or more of conductive contacts 302, signals may be passed through conductive contacts 302. In this arrangement, grounded conductive traces and signal-carrying conductive traces are opposite to one another in each pair of sidewall conductive traces along trench 106, thus providing improved signal fidelity and decreased cross-talk. In one such embodiment, note that the zig-zag patterns A and B are arranged with respect to one another around the trench 106 in an alternating fashion, such that the vertices of one zig-zag pattern are directly opposite the vertices of the other zig-zag pattern, with the trench 106 being between those opposing vertices.

One or more other conductive contacts 308 may also be included on surface 301. Other conductive contacts 308 include one or more conductive traces 309 to lead to a conductive sidewall trace along one sidewall edge of trench 106. As illustrated in FIG. 3A, other conductive contact 308 and its associated conductive trace 309 may be in a position along trench 106 that would have included a grounded conductive trace 304 had the zig-zag pattern of grounded conductive traces 304 been continued along the entire length of trench 106. In some embodiments, other conductive contact 308 is located at a far end, or near to the far end, of trench 106 along its length. In some embodiments, end conductive traces 310 are included to ground any end sidewall conductive traces of trench 106 (such as conductive traces 206 illustrated in FIG. 2.)

Figure 3B:
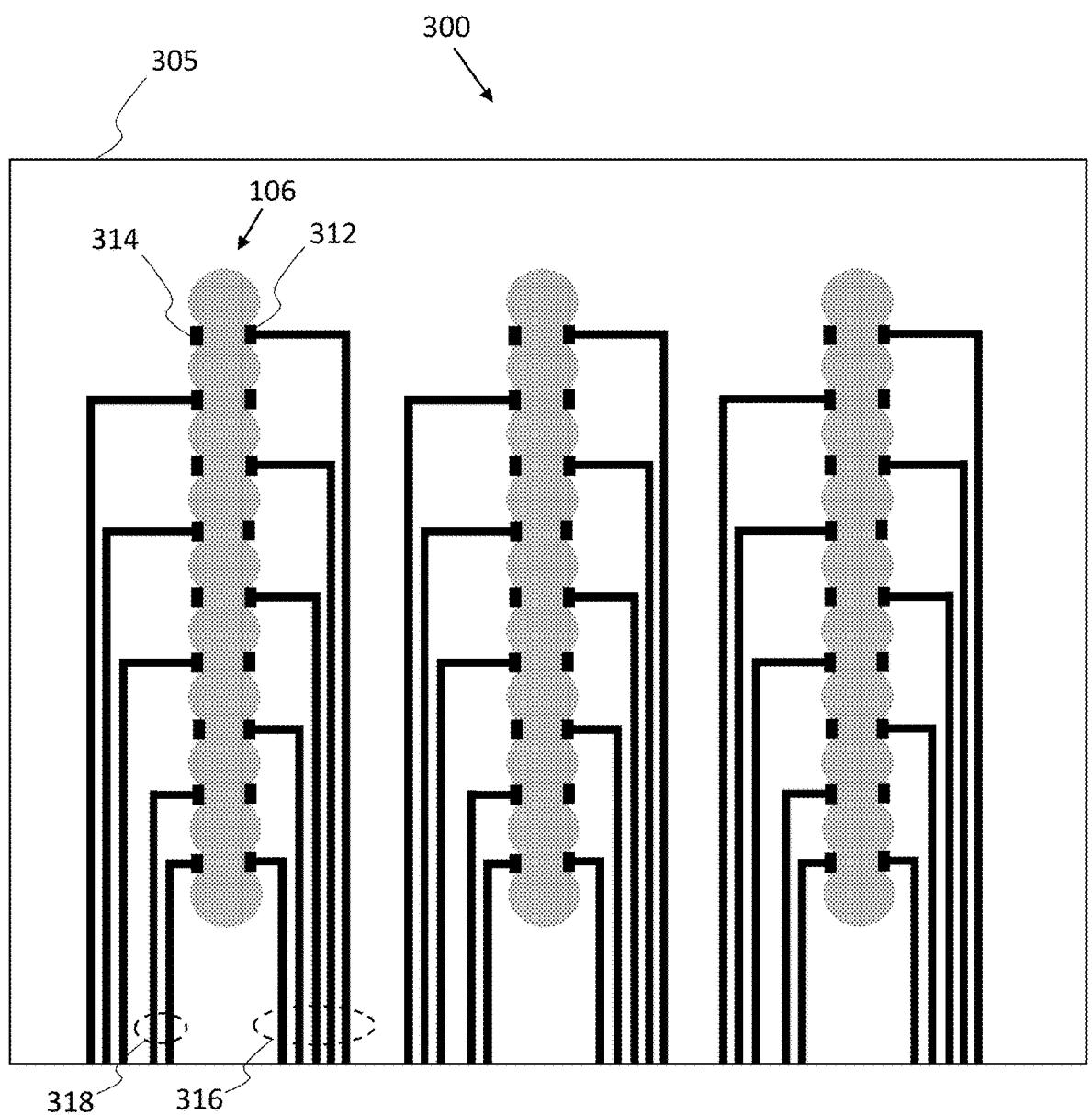
FIG. 3B illustrates a top-down view of an opposite parallel surface of the PCB board of FIG. 3A, configured in accordance with an embodiment of the present disclosure.

FIG. 3B illustrates a top-down view of an opposite surface 305 of PCB 300, according to some embodiments. In some examples, surface 305 may be a plane that is on an internal level of PCB 300 (i.e., within the thickness of PCB 300).

Trenches 106 are illustrated as breaking through surface 305 and are the same as those illustrated and discussed in FIG. 3A. Like the discussion of surface 301 of PCB 300, surface 305 includes an alternating arrangement of conductive regions 312 (i.e., in a zig-zag pattern) along the portion of the length of trench 106. Conductive regions 312 conductively couple to corresponding conductive contacts 302 via sidewall conductive traces of trench 106. Each conductive region 312 includes a patterned trace to route signals to other devices on PCB 300, or to route signals either received from another source external to PCB 300 or sent to another source external to PCB 300.

Surface 305 also includes an alternating arrangement of grounded conductive regions 314 (i.e., in a zig-zag pattern) along the portion of the length of trench 106, such that a given grounded conductive region 314 is arranged across from a corresponding conductive region 312 along the portion of the length of trench 106. Grounded conductive regions 314 may not be routed to any particular location away from trench 106. In some embodiments, grounded conductive regions 314 are omitted entirely.

According to an embodiment, conductive traces 316 may be grouped together on surface 305 and each carry related signals. For example, if a chip package containing a memory IC is coupled to surface 301 of PCB 300, then conductive traces 316 may carry the signals from the data lines of the memory. Another group of conductive traces 318 may be used to carry other related signals, such as, for example, the signals from the strobe lines of the memory. Another number of groups of conductive traces may be used to couple to various ones of conductive regions 312.

It will be appreciated that conductive regions 312 are illustrated for clarity purposes, and that in some embodiments conductive traces are patterned right up to the edges of trench 106 such that separate conductive regions 312 are not used.

Chip Package Design

Figure 4:
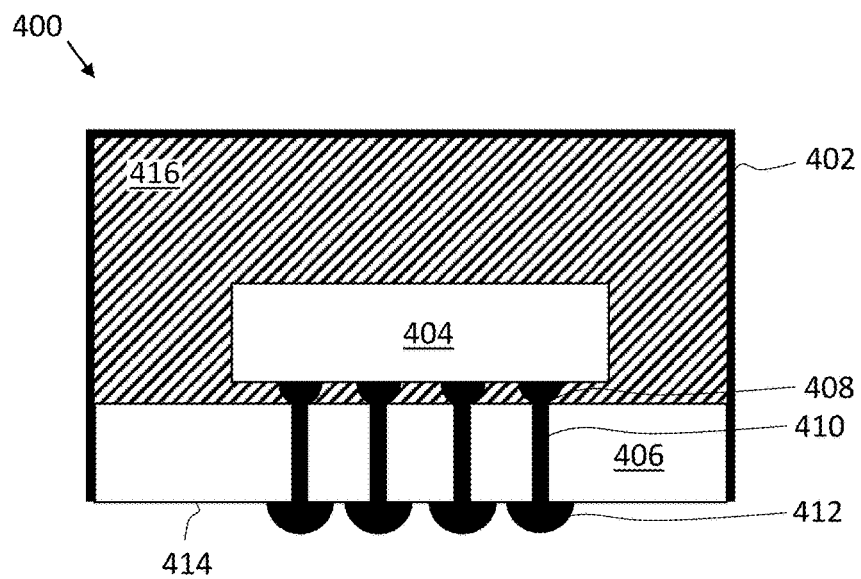
FIG. 4 illustrates a side, cross-sectional view of a microelectronics or "chip" package having one or more integrated circuit chips, configured in accordance with an embodiment of the present disclosure.

FIG. 4 illustrates an example embodiment of a chip package 400. Chip package 400 may include a housing 402 that protects one or more ICs 404 present within chip package 400. In some embodiments, housing 402 provides electromagnetic shielding and environmental protection for the components of chip package 400. In some embodiments, one or more ICs 404 include memory ICs. According to an embodiment, chip package 400 includes a package substrate 406 upon which one or more ICs 404 are bonded. One or more ICs 404 may be conductively coupled to package substrate 406 using first-level interconnects 408. In particular, conductive contacts at one face of package substrate 406 may be coupled to conductive contacts at faces of one or more ICs 404 by first-level interconnects 408. Some examples of first level interconnects 408 include solder bumps, but any suitable first-level interconnects 408 may be used (e.g., pins in a pin grid array arrangement or lands in a land grid array arrangement). In some embodiments, a solder resist is disposed between first-level interconnects 408. In other examples, first level interconnects 408 include wire bonds between one or more ICs 404 and package substrate 406.

Package substrate 406 may include a dielectric material, and may have conductive pathways (e.g., including conductive vias and lines) extending through the dielectric material between the faces, or between different locations on each face. In some embodiments, package substrate 406 may have a thickness less than 1 millimeter (e.g., between 0.1 millimeters and 0.5 millimeters). Additional conductive contacts may be disposed at an opposite face of package substrate 406 for conductively contacting second-level interconnects 412. One or more vias 410 extend through a thickness of package substrate 406 to provide conductive pathways between one or more of first-level interconnects 408 to one or more of second-level interconnects 412. Vias 410 are illustrated as single straight columns through package substrate 406 for ease of illustration and, in some embodiments, vias 410 are fabricated by multiple smaller stacked vias, or are staggered at different locations across package substrate 406. Second-level interconnects 412 may be used to electrically connect the components of chip package 400 to other conductive contacts on, for example, a circuit board. In the illustrated embodiment, second-level interconnects 412 are solder balls (e.g., for a ball grid array arrangement), but any suitable second-level interconnects 412 may be used (e.g., pins in a pin grid array arrangement or lands in a land grid array arrangement). In some embodiments, a solder resist is disposed between second-level interconnects 412. Second level interconnects 412 may be arranged on an underside 414 of chip package 400.

In some embodiments, a mold material 416 may be disposed around one or more ICs 404 included within housing 402 (e.g., between ICs 404 and package substrate 406 as an underfill material). In some embodiments, a thickness of mold material 416 may be less than 1 millimeter. Example materials that may be used for mold material 416 include epoxy mold materials, as suitable.

Figure 5:
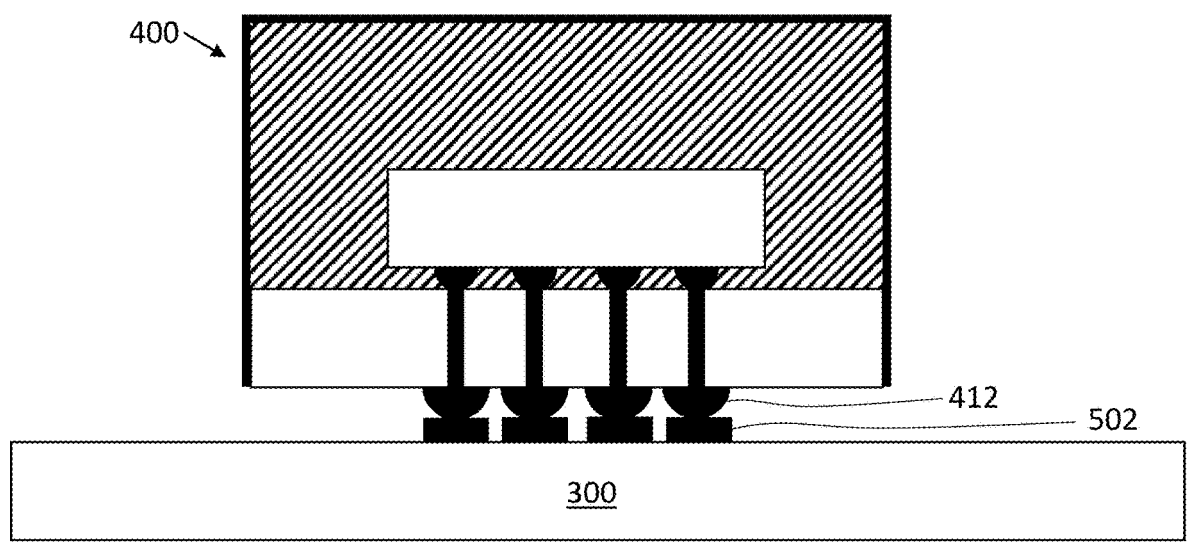
FIG. 5 illustrates a bonding procedure between the chip package of FIG. 4 and a PCB, in accordance with an embodiment of the present disclosure.

FIG. 5 illustrates an example of bonding chip package 400 to PCB 300 using second level interconnects 412. Specifically, second level interconnects 412 bond with corresponding conductive bonding locations 502 on a surface of PCB 300. Conductive contacts 302 and other conductive contacts 308 illustrated in FIG. 3A are examples of conductive bonding locations 502. In some embodiments, one or more of second level interconnects 412 bond directly to a larger conductive surface, such as ground plane 306 illustrated in FIG. 3A.

Figure 6:
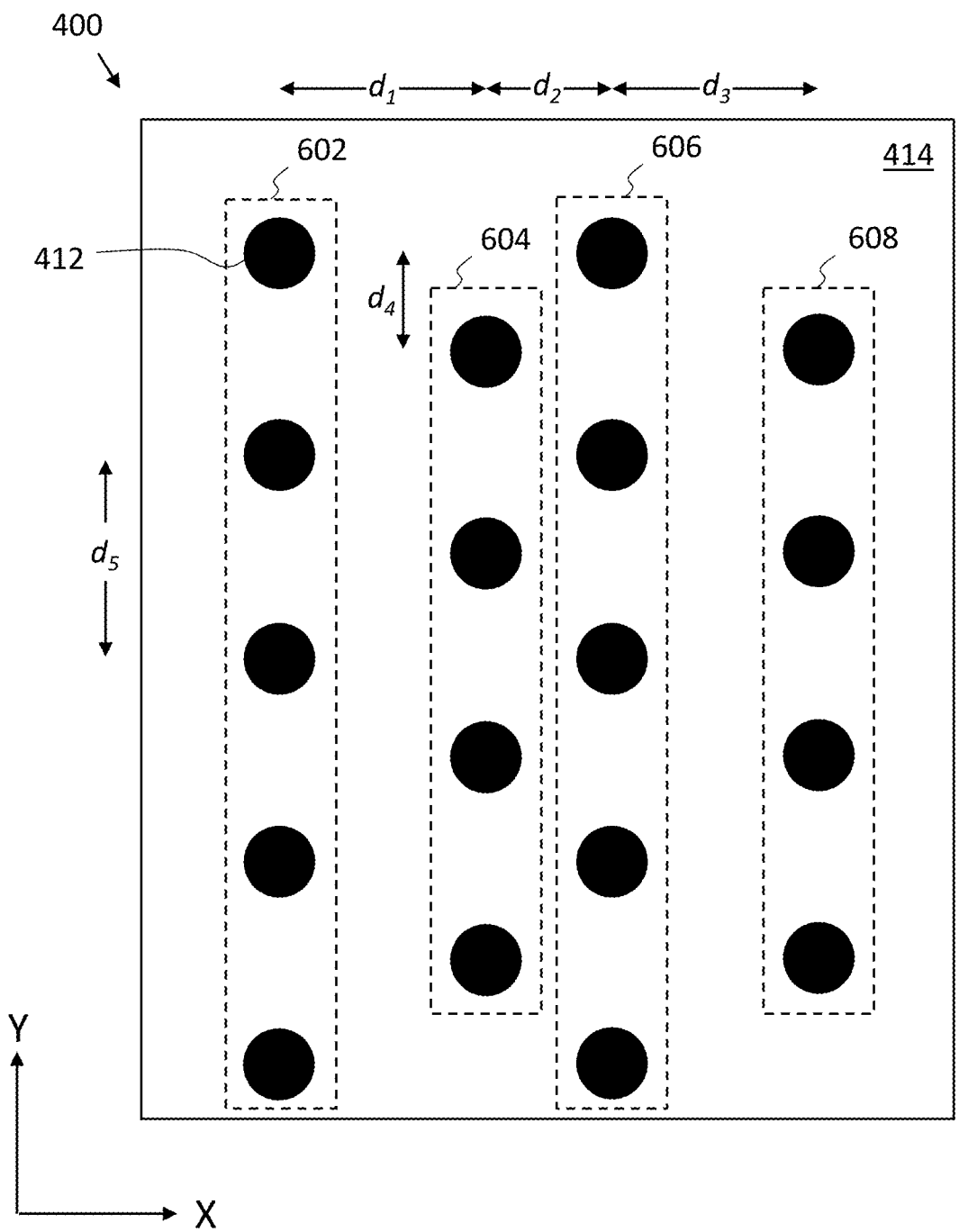
FIG. 6 illustrates an arrangement of conductive contacts on the underside of a chip package, in accordance with an embodiment of the present disclosure.

FIG. 6 illustrates an arrangement of second conductive contacts 412 (herein referred to as "conductive contacts 412" for brevity) on the underside 414 of chip package 400, according to an embodiment. Conductive contacts 412 may be arranged such that they contact corresponding conductive contacts on surface 301 of PCB 300 when bonding chip package 400 to PCB 300, according to some embodiments.

Conductive contacts 412 may be arranged in columns, such as in columns 602, 604, 606, and 608. The conductive contacts of a second column 604 may be separated from the conductive contacts of a first column 602 by a distance $d_1$ along the X-direction. Distance $d_1$ may be between about 0.5 mm and about 2.0 mm.

The conductive contacts of a third column 606 may be separated from the conductive contacts of second column 604 by a distance $d_2$ along the X-direction. Distance $d_2$ may be between about 0.3 mm and about 0.7 mm. According to an embodiment, distance $d_2$ is less than distance $d_1$.

The conductive contacts of a fourth column 608 may be separated from the conductive contacts of third column 606 by a distance $d_3$ along the X-direction. Distance $d_3$ may be between about 0.5 mm and about 2.0 mm. According to an embodiment, distance $d_3$ is greater than distance $d_2$. According to an embodiment, distance $d_3$ has the same magnitude as distance $d_1$.

Conductive contacts 412 are arranged in a staggered pattern such that alternating columns of conductive contacts 412 are shifted in the Y-direction. For example, the conductive contacts of second column 604 are shifted in the Y-direction by a distance $d_4$ with reference to the conductive contacts of first column 602. Distance $d_4$ may be between about 0.3 mm and about 0.7 mm. In some embodiments, distance $d_4$ has the same magnitude as distance $d_2$.

The conductive contacts of third column 606 are similarly shifted in the Y-direction with reference to the conductive contacts of second column 604. In some embodiments, the conductive contacts of third column 606 are shifted in the Y-direction by the distance $d_4$ with reference to the conductive contacts of second column 604.

The conductive contacts of fourth column 608 are similarly shifted in the Y-direction with reference to the conductive contacts of third column 606. In some embodiments, the conductive contacts of fourth column 608 are shifted in the Y-direction by the distance $d_4$ with reference to the conductive contacts of third column 606.

Each of the conductive contacts in one or more of columns 602, 604, 606, and 608 may be separated from one another by a same distance $d_5$. In some embodiments, distance $d_5$ is about 1 mm.

The general arrangement of conductive contacts 412 illustrated in FIG. 6 may be repeated over one or more areas of underside 414. In some embodiments, not all illustrated columns are present in the arrangement. For example, the conductive contacts of column 608 may be omitted for some applications.

Figure 7:
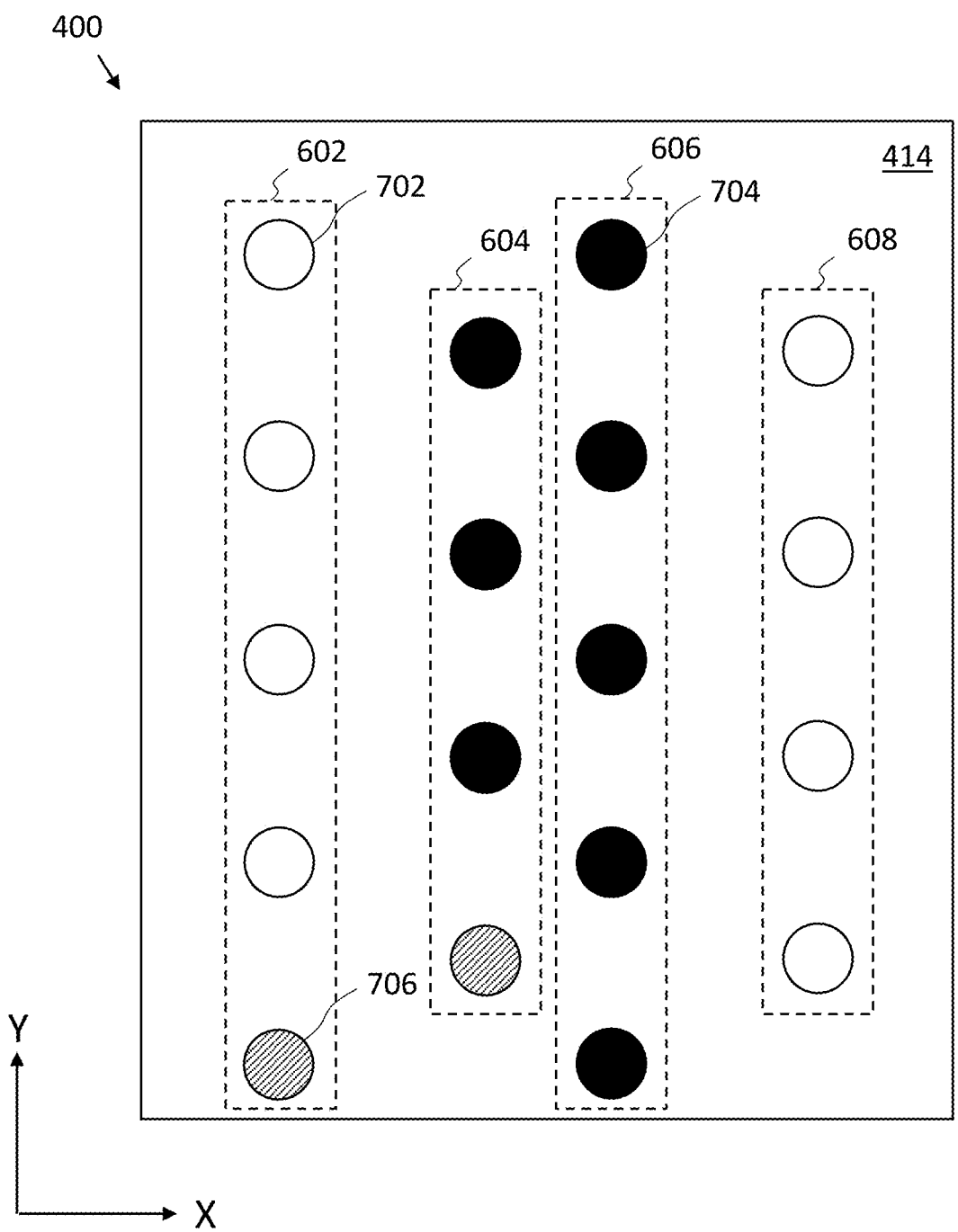
FIG. 7 illustrates the arrangement of conductive contacts of FIG. 6 for use in a memory application, in accordance with an embodiment of the present disclosure.

FIG. 7 illustrates the same arrangement of conductive contacts 412 illustrated in FIG. 6 with added context based on the function of various ones of the conductive contacts 412, according to an embodiment. For example, a first set of conductive contacts 702 may be ground contacts that contact ground plane 306 in FIG. 3A. First set of conductive contacts 702 may be in first column 602 and fourth column 608.

In some embodiments, a second set of conductive contacts 704 carry signals such as data lines for a memory. Second set of conductive contacts 704 may be in second column 604 and third column 606. In some embodiments, second set of conductive contacts 704 contact corresponding ones of conductive contacts 302 as illustrated in FIG. 3A.

In some embodiments, a third set of conductive contacts 706 carry other signals such as strobe lines for a memory. Third set of conductive contacts 706 may be located in adjacent columns, such as first column 602 and second column 604. In some embodiments, third set of conductive contacts 706 are located near an edge of underside 414. One or more of third set of conductive contacts 706 may contact corresponding ones of other conductive contacts 308 as illustrated in FIG. 3A.

Example Computing System

Figure 8:
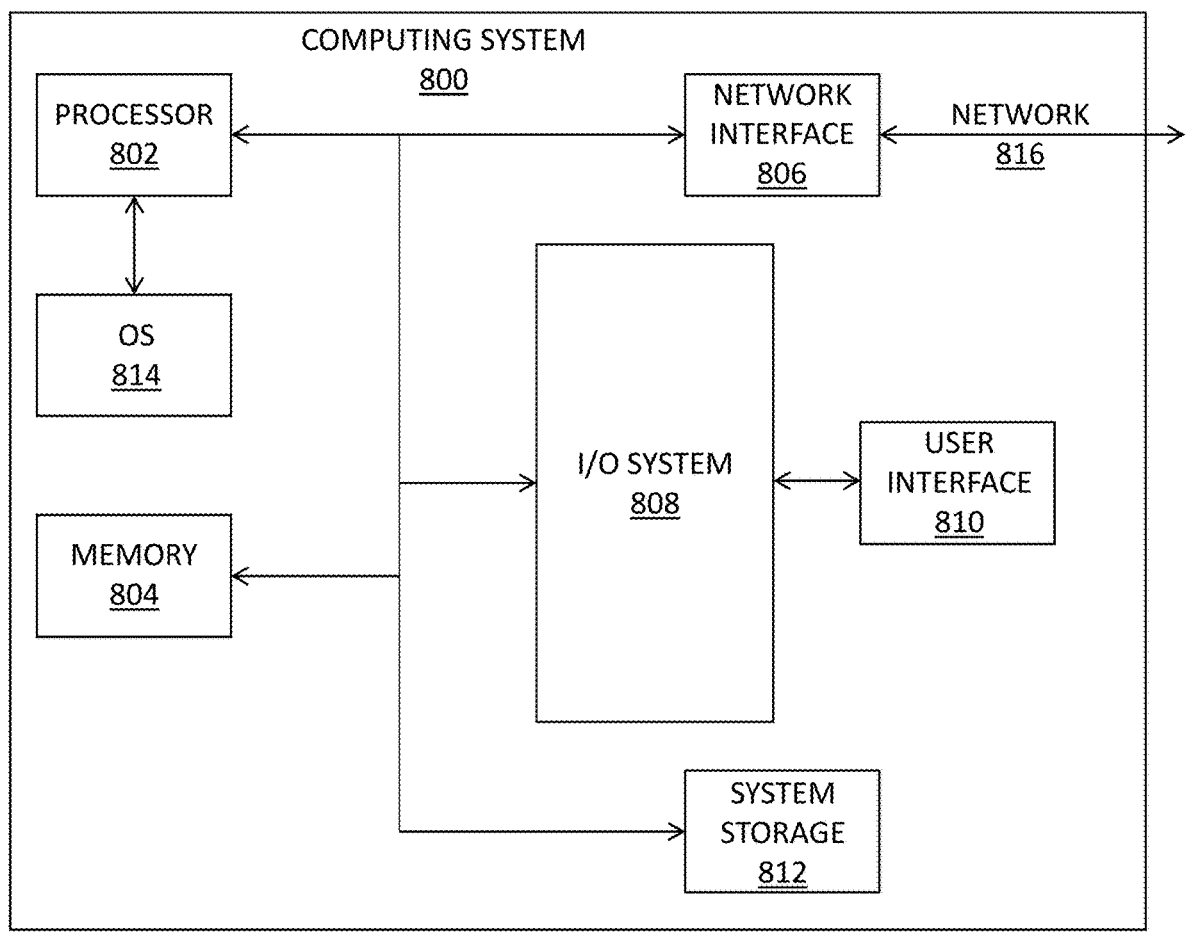
FIG. 8 illustrates an example computer system that can include one or more of the embodiments of the present disclosure.

FIG. 8 illustrates an example computing system 800 that may include one or more PCBs and/or one or more chip packages arranged in accordance with certain embodiments of the present disclosure. In some embodiments, computing system 800 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, computing system 800 may comprise any combination of a processor 802, a memory 804, a network interface 806, an input/output (I/O) system 808, a user interface 810, and a storage system 812. As can be further seen, a bus and/or interconnect is also provided to allow for communication between the various components listed above and/or other components not shown. Computing system 800 can be coupled to a network 816 through network interface 806 to allow for communications with other computing devices, platforms, or resources. Other componentry and functionality not reflected in the block diagram of FIG. 8 will be apparent in light of this disclosure, and it will be appreciated that other embodiments are not limited to any particular hardware configuration.

Processor 802 can be any suitable processor and may include one or more coprocessors or controllers to assist in control and processing operations associated with computing system 800. In some embodiments, processor 802 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. According to some embodiments of the present disclosure, processor 802 may be implemented on a PCB having a layout like that of PCB 300. According to some embodiments of the present disclosure, processor 802 may be incorporated in a chip package having a pin layout like the one described for the underside of chip package 400.

Memory 804 can be implemented using any suitable type of digital storage including, for example, flash memory and/or random access memory (RAM). In some embodiments, memory 804 may include various layers of memory hierarchy and/or memory caches as are known to those of skill in the art. Memory 804 may be implemented as a volatile memory device such as, but not limited to, a RAM, dynamic RAM (DRAM), or static RAM (SRAM) device. Storage system 812 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 812 may comprise technology to increase the storage performance enhanced protection for valuable digital media when multiple hard drives are included. According to some embodiments of the present disclosure, either or both memory 804 and storage system 812 may be implemented on a PCB having a layout like that of PCB 300. According to some embodiments of the present disclosure, either or both memory 804 and storage system 812 may be incorporated in a chip package having a pin layout like the one described for the underside of chip package 400.

Processor 802 may be configured to execute an Operating System (OS) 814 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS).

Network interface 806 can be any appropriate network chip or chipset which allows for wired and/or wireless connection between other components of computing system 800 and/or network 816, thereby enabling computing system 800 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 808 may be configured to interface between various I/O devices and other components of computing system 800. I/O devices may include, but not be limited to, a user interface 810. User interface 810 may include devices (not shown) such as a display element, touchpad, keyboard, mouse, and speaker, etc. I/O system 808 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 802 or any chipset of computing system 800.

It will be appreciated that in some embodiments, the various components of the computing system 800 may be combined or integrated in a system-on-a-chip (SoC) architecture. In some embodiments, the components may be hardware components, firmware components, software components or any suitable combination of hardware, firmware or software.

In various embodiments, computing system 800 may be implemented as a wireless system, a wired system, or a combination of both. When implemented as a wireless system, computing system 800 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, computing system 800 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a microelectronics package that includes a package substrate having a first surface and an opposite second surface, one or more integrated circuit chips coupled to the first surface of the package substrate, and an array of conductive contacts on the second surface of the package substrate. The array of conductive contacts are designed to electrically couple to one or more corresponding conductive contacts on a substrate separate from the microelectronics package. The array of conductive contacts has a staggered two-dimensional arrangement, such that a first column of conductive contacts is separated from a second column of conductive contacts in a first direction by a first distance. The second column of conductive contacts are located at different positions in a second direction perpendicular to the first direction from the first column of conductive contacts. The second column of conductive contacts is separated from a third column of conductive contacts in the first direction by a second distance less than the first distance. The third column of conductive contacts is located at a different position in the second direction from the second column of conductive contacts.

Example 2 includes the subject matter of Example 1, wherein the one or more integrated circuit chips include at least one memory IC.

Example 3 includes the subject matter of Example 2, wherein a plurality of conductive contacts in the first column of conductive contacts are electrically coupled to a ground plane of the memory IC.

Example 4 includes the subject matter of Example 2 or 3, wherein a plurality of conductive contacts in the second and third columns of conductive contacts are electrically coupled to data input/output lines of the memory IC.

Example 5 includes the subject matter of any one of Examples 2-4, wherein at least one conductive contact in the first column of conductive contacts is electrically coupled to a strobe line of the memory IC.

Example 6 includes the subject matter of Example 5, wherein the at least one conductive contact is located at a corner of the array of conductive contacts.

Example 7 includes the subject matter of any one of Examples 1-6, wherein the first column of conductive contacts is shifted from the second column of conductive contacts by a third distance in the second direction, and the third column of conductive contacts are shifted from the second column of conductive contacts by the third distance in the second direction.

Example 8 includes the subject matter of any one of Examples 1-7, wherein the third column of conductive contacts is separated from a fourth column of conductive contacts in the first direction by the first distance, wherein the fourth column of conductive contacts are located at different positions in the second direction from the third column of conductive contacts.

Example 9 includes the subject matter of Example 8, wherein the second column of conductive contacts is shifted from the third column of conductive contacts by a third distance in the second direction, and the fourth column of conductive contacts are shifted from the third column of conductive contacts by the third distance in the second direction.

Example 10 includes the subject matter of any one of Examples 1-9, wherein the array of conductive contacts comprises a ball grid array.

Example 11 is an electronic device that includes the microelectronics package of any one of claims 1-10.

Example 12 is a computing system that includes a substrate and the microelectronics package of any one of claims 1-10, where the microelectronics package is coupled to the substrate. The substrate includes a trench extending through a thickness of the substrate, a plurality of conductive traces, a first set of conductive contacts arranged in a first zig-zag pattern around a perimeter of the trench, and a second set of conductive contacts arranged in a second zig-zag pattern around the perimeter of the trench. The trench has one or more sidewalls that extend through the thickness of the substrate, and the trench is characterized as having a length and a width shorter than its length. The plurality of conductive traces is on the one or more sidewalls of the trench and extend through the thickness of the substrate.

Example 13 includes the subject matter of Example 12, wherein the first and second zig-zag patterns are arranged with respect to one another around the perimeter of the trench in an alternating fashion, such that the vertices of one zig-zag pattern are directly opposite the vertices of the other zig-zag pattern, with the trench being between the opposing vertices.

Example 14 includes the subject matter of Example 12 or 13, wherein the first set of conductive contacts is configured to route signals, and the second set of conductive contacts are coupled to a ground plane that is electrically isolated from the first set of the conductive contacts.

Example 15 is ball grid array on a bottom of a microelectronics package. The ball grid array includes a first column of conductive contacts, a second column of conductive contacts separated from the first column of conductive contacts by a first distance in a first direction, and a third column of conductive contacts separated from the second column of conductive contacts by a second distance in the first direction shorter than the first distance. The second column of conductive contacts is located at a different position in a second direction perpendicular to the first direction from the first column of conductive contacts. The third column of conductive contacts is located at a different position in the second direction from the second column of conductive contacts.

Example 16 includes the subject matter of Example 15, wherein the first column of conductive contacts is shifted from the second column of conductive contacts by a third distance in the second direction, and the third column of conductive contacts are shifted from the second column of conductive contacts by the third distance in the second direction.

Example 17 includes the subject matter of Example 15 or 16, further comprising a fourth column of conductive contacts separated from the third column of conductive contacts in the first direction, wherein the fourth column of conductive contacts are located at different positions in the second direction from the third column of conductive contacts.

Example 18 includes the subject matter of Example 17, wherein the fourth column of conductive contacts are separated from the third column of conductive contacts in the first direction by the first distance.

Example 19 includes the subject matter of Example 17 or 18, wherein the second column of conductive contacts is shifted from the third column of conductive contacts by a third distance in the second direction, and the fourth column of conductive contacts are shifted from the third column of conductive contacts by the third distance in the second direction.

Example 20 is a microelectronics package that includes the ball grid array of any one of claims 15-19.

Example 21 is a printed circuit board (PCB) having a first surface and an opposite, second surface. The PCB includes a trench extending through the PCB and having one or more sidewalls, a plurality of conductive traces on one or more sidewalls of the trench, and extending through the PCB, a first set of conductive contacts arranged in a first zig-zag pattern around a perimeter of the trench, and a second set of conductive contacts arranged in a second zig-zag pattern around the perimeter of the trench.

Example 22 includes the subject matter of Example 21, wherein the first and second zig-zag patterns are arranged with respect to one another around the perimeter of the trench in an alternating fashion, such that the vertices of one zig-zag pattern are directly opposite the vertices of the other zig-zag pattern, with the trench being between the opposing vertices.

Example 23 includes the subject matter of Example 21 or 22, wherein the first set of conductive contacts is configured to route signals, and the second set of conductive contacts is coupled to a ground plane that is electrically isolated from the first set of conductive contacts.

Example 24 includes the subject matter of any one of Examples 21-23, wherein a width of each of the plurality of conductive traces is substantially the same as a width of one or more patterned conductive traces on either the first or second surface of the PCB.

Example 25 includes the subject matter of any one of Examples 21-24, wherein the at least a portion of the first set of conductive contacts and a portion of the second set of conductive contacts are located on the first surface of the PCB.

Example 26 includes the subject matter of Example 25, wherein the second surface of the PCB includes a plurality of patterned conductive traces that directly couple to one or more of the conductive traces on one or more sidewalls of the trench.

Example 27 includes the subject matter of any one of Examples 21-26, wherein the first set of the conductive contacts is located on the first surface of the PCB and the second set of the conductive contacts is located on the second surface of the PCB.

Example 28 includes the subject matter of any one of Examples 21-27, wherein at least a portion of the first set of conductive contacts and/or a portion of the second set of conductive contacts is configured to directly couple to a plurality of corresponding contacts on an underside of a microelectronics package.

Example 29 includes the subject matter of any one of Examples 21-28, wherein the plurality of conductive traces is arranged in pairs across from one another along at least a portion of the length of the trench.

Example 30 is a computing system that includes the PCB of any one of claims 21-29.

What is claimed is:
1. A microelectronics package comprising:
a package substrate having a first surface and an opposite second surface;
one or more integrated circuit chips coupled to the first surface of the package substrate; and
an array of conductive contacts on the second surface of the package substrate, and configured to electrically couple to one or more corresponding conductive contacts on a substrate separate from the microelectronics package, wherein the array of conductive contacts has a staggered two-dimensional arrangement, such that a first column of conductive contacts is separated from a second column of conductive contacts in a first direction by a first distance without an interveing column of conductive contacts between the first column of conductive contacts and the second column of conductive contacts, wherein the second column of conductive contacts are located at different positions in a second direction perpendicular to the first direction from the first column of conductive contacts, and wherein the second column of conductive contacts is separated from a third column of conductive contacts in the first direction by a second distance less than the first distance, wherein the third column of conductive contacts is located at a different position in the second direction from the second column of conductive contacts.

2. The microelectronics package of claim 1, wherein the one or more integrated circuit chips include at least one memory IC.

3. The microelectronics package of claim 2, wherein a plurality of conductive contacts in the first column of conductive contacts are electrically coupled to a ground plane of the memory IC.

4. The microelectronics package of claim 2, wherein a plurality of conductive contacts in the second and third columns of conductive contacts are electrically coupled to data input/output lines of the memory IC.

5. The microelectronics package of claim 2, wherein at least one conductive contact in the first column of conductive contacts is electrically coupled to a strobe line of the memory IC.

6. The microelectronics package of claim 1, wherein the first column of conductive contacts is shifted from the second column of conductive contacts by a third distance in the second direction, and the third column of conductive contacts are shifted from the second column of conductive contacts by the third distance in the second direction.

7. The microelectronics package of claim 1, wherein the third column of conductive contacts is separated from a fourth column of conductive contacts in the first direction by the first distance, wherein the fourth column of conductive contacts are located at different positions in the second direction from the third column of conductive contacts.

8. The microelectronics package of claim 7, wherein the second column of conductive contacts is shifted from the third column of conductive contacts by a third distance in the second direction, and the fourth column of conductive contacts are shifted from the third column of conductive contacts by the third distance in the second direction.

9. An electronic device, comprising the microelectronics package of claim 1.

* * * * *